(12) United States Patent
Tachibana et al.

(10) Patent No.: US 10,773,345 B2
(45) Date of Patent: *Sep. 15, 2020

(54) SOLDER ALLOY, SOLDER BALL, CHIP SOLDER, SOLDER PASTE, AND SOLDER JOINT

(71) Applicant: Senju Metal Industry Co., Ltd., Tokyo (JP)

(72) Inventors: Ken Tachibana, Chiba (JP); Takahiro Hattori, Tochigi (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/083,225

(22) PCT Filed: Mar. 8, 2017

(86) PCT No.: PCT/JP2017/009169
§ 371 (c)(1),
(2) Date: Sep. 7, 2018

(87) PCT Pub. No.: WO2017/154957
PCT Pub. Date: Sep. 14, 2017

(65) Prior Publication Data
US 2019/0070696 A1    Mar. 7, 2019

(30) Foreign Application Priority Data

Mar. 8, 2016   (JP) .................................. 2016-044779

(51) Int. Cl.
*B23K 35/26*      (2006.01)
*C22C 13/00*      (2006.01)
(Continued)

(52) U.S. Cl.
CPC .......... *B23K 35/262* (2013.01); *B23K 35/025* (2013.01); *B23K 35/26* (2013.01);
(Continued)

(58) Field of Classification Search
CPC ........ B23K 35/26; B23K 35/262; C22C 13/00
(Continued)

(56) References Cited

U.S. PATENT DOCUMENTS 6,554,180 B1   4/2003   Katoh et al.
7,029,542 B2   4/2006   Amagai et al.
(Continued)

FOREIGN PATENT DOCUMENTS

CN   1400081 A      3/2003
CN   101072886 A   11/2007
(Continued)

*Primary Examiner* — Weiping Zhu
(74) *Attorney, Agent, or Firm* — The Webb Law Firm

(57) ABSTRACT

Provided is a solder alloy, a solder ball, a chip solder, a solder paste and a solder joint in which discoloration is suppressed and a growth of an oxide film is suppressed under a high temperature and high humidity environment. The solder alloy contains 0.005% by mass or more and 0.1% by mass or less of Mn, 0.001% by mass or more and 0.1% by mass or less of Ge and more than 0% by mass and 4% by mass or less of Ag, and a principal ingredient of remainder is Sn.

8 Claims, 2 Drawing Sheets

(51) Int. Cl.
*H01L 23/00* (2006.01)
*H05K 3/34* (2006.01)
*B23K 35/02* (2006.01)

(52) U.S. Cl.
CPC .............. *C22C 13/00* (2013.01); *H01L 24/00* (2013.01); *H05K 3/34* (2013.01); *H05K 3/3463* (2013.01); *H05K 3/3484* (2013.01)

(58) Field of Classification Search
USPC ........................................................ 420/557
See application file for complete search history.

(56) References Cited

U.S. PATENT DOCUMENTS

| | | | |
|---|---|---|---|
| 7,750,475 | B2 | 7/2010 | Souma et al. |
| 10,343,238 | B2 | 7/2019 | Suzuki et al. |
| 10,434,608 | B2 | 10/2019 | Tachibana et al. |
| 2002/0051728 | A1 | 5/2002 | Sato et al. |
| 2003/0021718 | A1* | 1/2003 | Munekata ............ B23K 1/0016 420/560 |
| 2004/0262779 | A1 | 12/2004 | Amagai et al. |
| 2005/0036902 | A1 | 2/2005 | Amagai et al. |
| 2005/0100474 | A1 | 5/2005 | Huang et al. |
| 2007/0243098 | A1 | 10/2007 | Ohnishi et al. |
| 2012/0038042 | A1 | 2/2012 | Sasaki et al. |
| 2014/0054766 | A1* | 2/2014 | Hashino ............ B23K 35/025 257/737 |
| 2015/0328722 | A1 | 11/2015 | Suzuki et al. |
| 2017/0216975 | A1 | 8/2017 | Tachibana et al. |

FOREIGN PATENT DOCUMENTS

| | | |
|---|---|---|
| CN | 101508062 A | 8/2009 |
| CN | 103480978 A | 1/2014 |
| EP | 1382413 A1 | 1/2004 |
| JP | 9155586 A | 6/1997 |
| JP | 2001129682 A | 5/2001 |
| JP | 200257177 A | 2/2002 |
| JP | 2002248596 A | 9/2002 |
| JP | 20031482 A | 1/2003 |
| JP | 200458085 A | 2/2004 |
| JP | 2004261863 A | 9/2004 |
| JP | 2005103645 A | 4/2005 |
| JP | 2010247167 A | 11/2010 |
| JP | 201427122 A | 2/2014 |
| JP | 5880766 B1 | 2/2016 |
| RU | 2219030 C1 | 12/2003 |
| RU | 2541249 C2 | 8/2014 |
| WO | 2005035180 A1 | 4/2005 |
| WO | 2006011204 A1 | 2/2006 |
| WO | 2013052428 A1 | 4/2013 |
| WO | 2014097390 A1 | 6/2014 |
| WO | 2015037279 A1 | 3/2015 |

* cited by examiner

[FIG. 1]
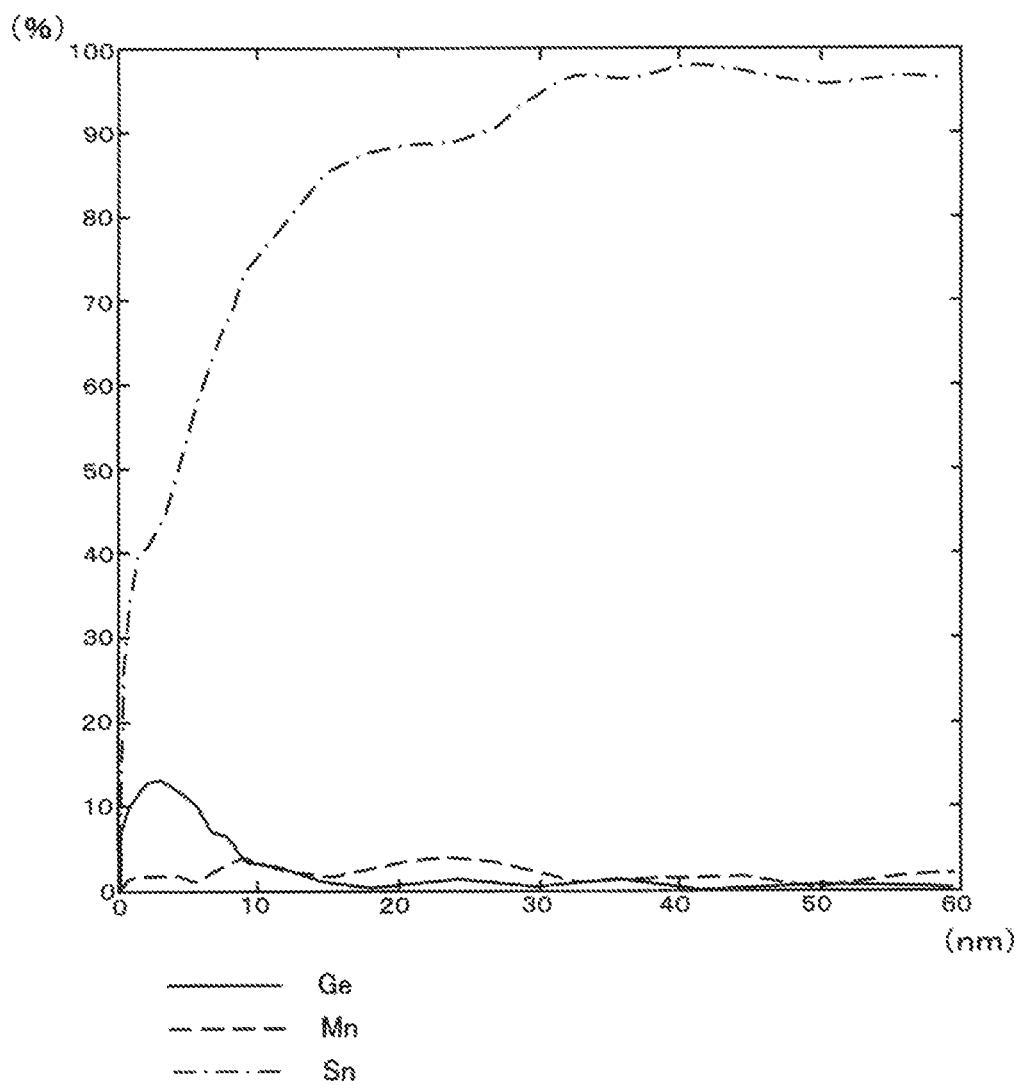

[FIG. 2]
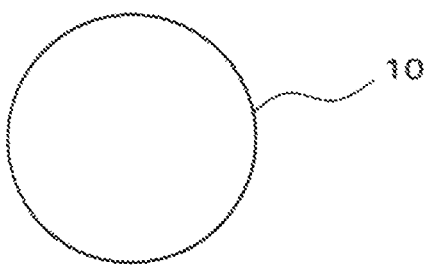
[FIG. 3]
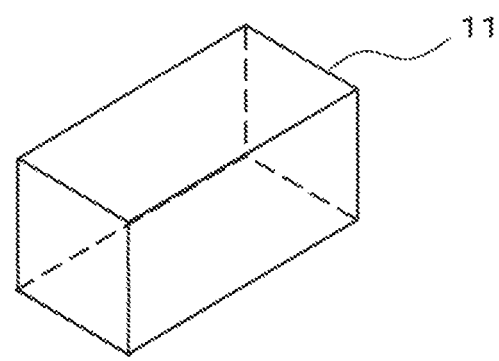

SOLDER ALLOY, SOLDER BALL, CHIP SOLDER, SOLDER PASTE, AND SOLDER JOINT

CROSS-REFERENCE TO RELATED APPLICATIONS

This application is the United States national phase of International Application No. PCT/JP2017/009169 filed Mar. 8, 2017, and claims priority to Japanese Patent Application No. 2016-044779 filed Mar. 8, 2016, the disclosures of which are hereby incorporated in their entirety by reference.

TECHNICAL FIELD

The present invention relates to a solder alloy, which allows discoloration to be suppressed and deterioration in wettability to be suppressed, a solder ball, a chip solder, a solder paste and a solder joint, which use this solder alloy.

BACKGROUND ART

Since a solder used for joining electronic components to a printed circuit board generally has a principal ingredient of Sn, Sn and $O_2$ in the air may be reacted to form an oxide film by Sn oxides on a surface of the solder based on any storage conditions before the use thereof. By this tendency, when storing it under a high temperature and high humidity environment, thickness of an oxide film formed on its surface has a tendency of becoming thicker and there may be a case where its surface gloss is lost or a yellow discoloration occurs. It is difficult for flux to remove the oxide film from the solder surface during the soldering and the wettability deteriorates if any oxide film remains on the solder surface, so that fusion properties thereof deteriorate, thereby causing any soldering defect to occur.

On the other hand, in recent years, together with development of compact information devices, downsizing of electronic components to be installed on the information device have also rapidly been progressed. In order to meet the downsizing requirement, a ball grid array (hereinafter, referred to as "BGA"), in which electrodes are provided on a back surface thereof, is applied to an electronic component to cope with the small and narrow connection terminal or the reduced mounting area.

As an electronic component to which the BGA is applied, for example, a semiconductor package is exemplified. In electrodes of the semiconductor package, solder bumps are formed. These solder bumps are formed by joining solder balls in each of which the solder alloy is made spherical to the electrodes of the semiconductor package.

The semiconductor package to which the BGA is applied is mounted on a printed circuit board to which solder paste has been applied with the solder bumps being aligned with the electrodes of the board and by joining the solder paste melted by heating to the solder bumps and the electrodes of the board, the semiconductor package is installed on the board.

As described above, on the solder ball having the principal ingredient of Sn, Sn and $O_2$ in the air may be reacted to form an oxide film by Sn oxides on a surface of the ball. When forming the oxide film on a surface of the solder ball, the phenomenon may occur such that any gloss of the solder ball is lost or a yellow discoloration occurs. As a visual inspection of the solder ball, there is a case where the discoloration of the surface of the solder ball is utilized and unless the discoloration of the surface of the solder ball can be suppressed, it is a strong likelihood to determine that the solder ball is unavailable to use.

In addition, although a flux is generally used when joining in order to remove any oxide film formed during the storage thereof, the wettability deteriorates when the oxide film is insufficiently removed to remain on the surface of the solder ball, thereby causing the fusion properties thereof to deteriorate. A deterioration result of the fusion properties causes, as the phenomenon, any soldering defect to occur.

Although it is conceivable to suppress a growth of the oxide film on the surface of the solder ball by strictly managing the storage conditions thereof, there are a variety of the storage conditions and any issues of the growth of the oxide film and the deterioration of the fusion properties accompanying this are always bothered. Therefore, it is necessary to suppose various kinds of storage conditions to be able to suppress the growth of the oxide film on the surface of the solder ball. Although the solder ball has been described as an example, the issues are common issues of the whole solder having the principle ingredient of Sn in spite of the solder ball.

In order to address the issues, Ge has been generally added to the solder alloy having the principle ingredient of Sn (see, for example, Patent Document 1). In this Patent Document 1, a technology of adding a total amount of 0.006% by mass through 0.1% by mass of one or two or more elements selected from Ge, Ni, P, Mn, Au, Pd, Pt, S, Bi, Sb and In to the solder alloy containing Sn, Ag and Cu, in order to improve the joining property by the soldering, has been disclosed. Patent Document 1 has also disclosed that Ge improves oxidation resistance and Ni, P, Mn, Au, Pd, Pt, S, Bi, Sb and In have effects of lowering the melting point and enhancing joining strength.

In addition, appearance characteristics are also important as quality to be desired in joining by the soldering in addition to secure joining. In the solder alloy having the principal ingredient of Sn, Sn and $O_2$ in the air may be reacted to form Sn oxides which become an oxide film to cover on a surface of the solder alloy. Sn oxides discolor in yellow and the surface of the solder alloy also discolors in yellow, so that there may be a case where it is determined as any failure by the visual inspection.

Accordingly, in order to change optical properties on a surface of the oxide film, a technology of adding a total amount of 1 ppm by mass or more and 0.1% by mass or less of one or two or more elements selected from Li, Na, K, Ca, Be, Mg, Sc, Y, lanthanoids, Ti, Zr, Hf, Nb, Ta, Mo, Zn, Al, Ga, In, Si, and Mn to the solder alloy having the principal ingredient of Sn has been proposed (see, for example, Patent Document 2)

DOCUMENTS FOR PRIOR ART

Patent Documents

Patent Document 1: Japanese Patent Application Publication No. 2005-103645
Patent Document 2: Japanese Patent Application Publication No. 2010-247167

SUMMARY OF THE INVENTION

Problems to be Solved by the Invention

As disclosed in Patent Document 1, when adding Ge to the solder alloy having the principal ingredient of Sn, it is supposed that the discoloration of the solder surface can be suppressed under the high temperature environment. However, even when adding Ge thereto, the discoloration of the solder surface cannot be suppressed under the high temperature and high humidity environment. In addition, since the solder alloy having the principal ingredient of Sn, to which Mn is added, has less wettability, Patent Document 1 does not disclose any contents of respective Ge and Mn in a case of an additive combination thereof, so that the concurrent addition of Ge and Mn is not supposed.

Further, Patent Document 2 discloses that when adding Mn to the solder alloy having the principle ingredient of Sn, the optical property of the surface of the oxide film alters and even when the surface is oxidized to have the same thickness, a color tone thereof alters, so that any yellow discoloration does not occur. However, the solder alloy having the principal ingredient of Sn, to which Mn is added, cannot suppress the discoloration under a high temperature environment and a high temperature and high humidity environment and has deteriorated wettability.

As described above, both of Patent Documents 1 and 2 do not discloses any a combination of particular elements (Ge and Mn) which has effects of suppressing the discoloration and suppress any deterioration in wettability among the disclosed elements and particularly, such effects cannot be acquired under the high temperature and high humidity environment.

The present invention solves the above problems, and has an object to provide a solder alloy, which allows the discoloration to be suppressed and the deterioration in wettability to be suppressed, a solder ball, a chip solder, a solder paste and a solder joint, which use this solder alloy.

Means for Solving the Problems

The present invention is made in light of being able to suppress the deterioration in wettability and prevent the discoloration by adding a predetermined amount of both Mn and Ge as the particular elements. The present invention is made by founding that Mn is easier to produce oxides than Sn and the production of Mn oxides can suppress any growth of the oxide film by change with time of Sn oxides and that Ge oxides have any discoloration prevention effect.

Accordingly, the invention of Clause 1 relates to a solder alloy containing 0.005% by mass or more and 0.1% by mass or less of Mn, 0.001% by mass or more and 0.1% by mass or less of Ge, more than 0% by mass and 4% by mass or less of Ag and remainder of Sn.

The invention of Clause 2 is an invention according to the invention of Clause 1, and relates to the solder alloy wherein an amount of Mn is equal to or less than that of Ge.

The invention of Clause 3 is an invention according to the invention of Clause 1 or 2, and relates to the solder alloy further containing a total amount of 0.002% by mass or more and 0.1% by mass or less of at least one element selected from a group consisting of P and Ga.

The invention of Clause 4 is an invention according to the invention of any one of Clauses 1 through 3, and relates to the solder alloy further containing a total amount of 0.005% by mass or more and 0.3% by mass or less of at least one element selected from a group consisting of Ni, Co and Fe.

The invention of Clause 5 is an invention according to the invention of any one of Clauses 1 through 4, and relates to the solder alloy further containing a total amount of 0.1% by mass or more and 10% by mass or less of at least one element selected from a group consisting of Bi, In and Sb.

The invention of Clause 6 relates to a solder ball acquired by using the solder alloy according to any one of Clauses 1 through 5.

The invention of Clause 7 relates to a chip solder acquired by using the solder alloy according to any one of Clauses 1 through 5.

The invention of Clause 8 relates to a solder paste acquired by using the solder alloy according to any one of Clauses 1 through 5.

The invention of Clause 9 relates to a solder joint acquired by using the solder alloy according to any one of Clauses 1 through 5.

The invention of Clause 10 relates to a solder joint acquired by using the solder ball according to Clause 6.

The invention of Clause 11 relates to a solder joint acquired by using the chip solder according to Clause 7.

The invention of Clause 12 relates to a solder joint acquired by using the solder paste according to Clause 8.

Effects of the Invention

According to the present invention, by containing 0.005% by mass or more and 0.1% by mass or less of Mn, 0.001% by mass or more and 0.1% by mass or less of Ge, more than 0% by mass and 4% by mass or less of Ag in the solder alloy having the principal ingredient of Sn, most Ge oxides are distributed on an outermost surface side of the oxide film containing Sn oxides, Mn oxides and Ge oxides, thereby obtaining the discoloration prevention effect even under the high temperature and high humidity environment. In addition, by containing Mn, the production of Sn oxides is suppressed so that an increase in the thickness of the oxide film can be suppressed, thereby improving the fusion properties.

In addition, a predetermined amount of Ag contained in the solder alloy does not inhibit the discoloration prevention effects and the fusion property improvement effects by containing the predetermined amounts of Mn and Ge in the solder alloy, and the predetermined amounts of Mn and Ge contained in the solder alloy do not inhibit any effect of improving a temperature cycle property by containing the predetermined amount of Ag in the solder alloy.

BRIEF DESCRIPTION OF THE DRAWINGS

FIG. 1 is a graph showing a distribution of oxides in a Sn-based solder alloy containing Mn and Ge.

FIG. 2 is a configuration diagram showing an example to which the solder alloy according to the invention is applied.

FIG. 3 is a configuration diagram showing another example to which the solder alloy according to the invention is applied.

EMBODIMENT FOR CARRYING OUT THE INVENTION

In the solder alloy having the principle ingredient of Sn, production of Sn oxides ($SnO_x$) on the outermost surface of the solder alloy causes any discoloration. The fusion properties thereof also deteriorate.

On the other hand, in the solder alloy having the principle ingredient of Sn, to which Ge is added, it is possible to suppress the discoloration under the high temperature environment by the discoloration prevention effect of the Ge oxides ($GeO_z$), but it is impossible to suppress the discoloration under the high temperature and high humidity environment and the fusion properties thereof also deteriorates.

Well, it is known that Mn oxides are easier to be formed as compared with Sn oxides because its standard free energy of formation of the oxides is large. Therefore, in the solder alloy having the principle ingredient of Sn, to which Mn is added, the production of Sn oxides is suppressed. Any discoloration prevention effect, however, is not acquired by the addition of Mn and it is impossible to suppress the discoloration under the high temperature environment or under the high temperature and high humidity environment.

Whereas, in the solder alloy having the principle ingredient of Sn, to which predetermined amounts of Mn and Ge are added, it has been found that Ge oxides distribute unevenly toward the outermost side of the oxide film by the addition of Mn. This allows Ge oxides ($GeO_2$), which has the discoloration prevention effect under the high temperature and high humidity environment, to remain in the outermost side of the film formed by the oxides. In addition, the production of Mn oxides ($Mn_aO_y$) suppresses the production of Sn oxides. Therefore, it is possible to suppress the discoloration under the high temperature and high humidity environment and suppress the production of Sn oxides, thereby improving the fusion property thereof.

0.005% by mass or more and 0.1% by mass or less of Mn is contained as an amount by which the production and growth of Sn oxides can be suppressed by reacting Mn and $O_2$ to suppress the reaction of Sn and $O_2$. 0.001% by mass or more and 0.1% by mass or less of Ge is contained as an amount by which Ge oxides can remain in the outermost side of the oxide film. It is preferable that 80% by mass or more of Sn is contained.

In the solder alloy having the principle ingredient of Sn, in which Mn and Ge are contained within a range of this invention, Mn oxides ($Mn_aO_y$) suppresses any growth of Sn oxides and Ge oxides ($GeO_2$), which has the discoloration prevention effect, remains in the outermost side. This enables the discoloration to be suppressed even under the high temperature and high humidity environment and enables the growth of oxides to be suppressed, thereby improving the fusion property thereof. The effects cannot be lost even if another element is added when Mn and Ge stay within the range of this invention.

Accordingly, Cu or Ag is contained in accordance with purposes of use. For example, when an object to be jointed contains Cu, more than 0% by mass and 1% by mass or less of Cu is contained in order to suppress so-called thinning of copper in which Cu dissolves in the solder alloy. Alternatively, more than 0% by mass and 4% by mass or less of Ag is contained in order to improve the temperature cycle property. Ag has an effect of aiming at further improving the temperature cycle property by depositing any compounds having an intermetallic compound network of $Ag_3Sn$ in the solder matrix to make an alloy of a deposition and dispersion strengthening type.

Further, another element may be optionally selected in accordance with purposes of use. In connection with said another element, the following elements may be contained as optional components.

(a) At least one element selected from a group consisting of P and Ga:
A total amount of at least one element selected from a group consisting of P and Ga is an amount of a single element when one element is selected from the group of these elements or a total amount of two elements when two elements are selected but is 0.002% by mass or more and 0.1% by mass or less. 0.003% by mass or more and 0.01% by mass or less are preferable.

These elements have effects of improving the wettability. Regarding the amounts of respective elements, the amounts of P are preferably 0.002% by mass or more and 0.005% by mass or less and the amounts of Ga are preferably 0.002% by mass or more and 0.02% by mass or less.

(b) At least one element selected from a group consisting of Ni, Co and Fe:
A total amount of at least one element selected from a group consisting of Ni, Co and Fe is an amount of a single element when one element is selected from the group of these elements or a total amount of two elements or more when two elements or more are selected but is 0.005% by mass or more and 0.3% by mass or less. 0.01% by mass or more and 0.05% by mass or less are preferable.

These elements suppress diffusion of components in a plating layer applied to a semiconductor element or an external substrate to the solder alloy during soldering. Therefore, these elements maintain a structure of the solder alloy constituting a solder joint or have an effect of thinning thickness of the intermetallic compound layer formed at a joined interface. Therefore, these elements enable joint strength of the solder joint to be increased. Regarding the amounts of respective elements, the amounts of Ni are preferably 0.02% by mass or more and 0.07% by mass or less, the amounts of Co are preferably 0.02% by mass or more and 0.04% by mass or less and the amounts of Fe are preferably 0.005% by mass or more and 0.02% by mass or less. Particularly, Ni among these elements is a preferable element to exhibit the above-described effect.

(c) At least one element selected from a group consisting of Bi, In and Sb:
A total amount of at least one element selected from a group consisting of Bi, In and Sb is an amount of a single element when one element is selected from the group of these elements or a total amount of two elements or more when two elements or more are selected but is 0.1% by mass or more and 10% by mass or less. 0.5% by mass or more and 5.0% by mass or less are preferable. 0.8% by mass or more and 4.5% by mass or less are particularly preferable.

These elements are expected for improving the solder strength and maintaining reliability of the jointed portions. Regarding the amounts of respective elements, the amounts of Bi are preferably 0.5% by mass or more and 5.0% by mass or less, the amounts of In are preferably 0.2% by mass or more and 5.0% by mass or less and the amounts of Sb are preferably 0.1% by mass or more and 5.0% by mass or less.

The following will describe a production process of the oxides based on an estimated study at present. Sn-based solder alloy such as Sn—Ag based solder alloy, Sn—Cu based solder alloy and the like will be described as the examples of the solder alloy having the principal ingredient of Sn.

(1) Regarding the Sn-Based Solder Alloy Containing Mn and Ge (Executed Examples)

In the Sn-based solder alloy containing Mn and Ge, $O_2$ in the air and Sn, Mn and Ge in the solder alloy react in an initial state of the production process of the oxides to form an oxide film by Sn oxides ($SnO_x$), Mn oxides ($Mn_aO_y$) and Ge oxides ($GeO_2$) on a surface of the solder alloy.

When setting the solder alloy on which the oxide film has been formed in such an initial state under the high temperature and high humidity environment where there are $H_2O$ and $O_2$ exceeding a predetermined amount thereof, it is conceivable that a part of the oxide film by Sn oxides, Mn oxides and Ge oxides formed on the outermost surface side of the solder alloy is destroyed by $H_2O$ which has high energy.

When destroying a part of the oxide film, Mn oxides are produced with the production of Sn oxides being suppressed according to the relationship of magnitudes of standard free energy of formation of Sn oxides and Mn oxides, so that Mn oxides distribute almost evenly toward a thickness direction of the oxide film.

In addition, in the solder alloy having the principal ingredient of Sn, in which a predetermined amount of Mn and Ge are contained, Sn oxides in the outermost surface side of the oxide film decreases and Ge oxides distribute unevenly in the outermost surface side of the oxide film.

Therefore, in Sn-based solder alloy containing Mn and Ge, the production of the Sn oxides is suppressed and Ge oxides distribute unevenly in the outermost surface side of the oxide film, thereby allowing the discoloration to be suppressed by the discoloration prevention effect of Ge oxides.

(2) Regarding the Sn-Based Solder Alloy Not Containing Mn and Ge (Comparison Examples)

In the Sn-based solder alloy not containing Mn and Ge, $O_2$ in the air and Sn in the solder alloy react in an initial state of the production process of the oxides to form an oxide film by Sn oxides ($SnO_x$) on a surface of the solder alloy.

When exposing the solder alloy on which the oxide film has been produced in such an initial state under the high temperature environment or the high temperature and high humidity environment, it is conceivable that a part of the oxide film formed on the surface is destroyed, and that Sn in the solder alloy and $O_2$ in the air react to further produce Sn oxides.

Accordingly, in Sn-based solder alloy not containing M and Ge, Sn oxides cause the discoloration.

(3) Regarding the Sn-Based Solder Alloy Containing Mn But Not Containing Ge (Comparison Examples)

In the Sn-based solder alloy containing Mn but not containing Ge, $O_2$ in the air and Sn and Mn in the solder alloy react in an initial state of the production process of the oxides to produce an oxide film by Sn oxides ($SnO_x$) and Mn oxides ($Mn_aO_y$) on a surface of the solder alloy.

When exposing the solder alloy on which the oxide film has been formed in such an initial state under the high temperature environment or the high temperature and high humidity environment, it is conceivable that a part of the oxide film formed on the surface is destroyed.

Mn oxides are produced with the production of Sn oxides being suppressed according to the relationship of magnitudes of standard free energy of formation of Sn oxides and Mn oxides.

However, Mn oxides has no discoloration prevention effect and in the Sn-based solder alloy containing Mn but not containing Ge, Mn oxides discolor like the Sn oxides, so that it is impossible to suppress the discoloration.

(4) Regarding the Sn-Based Solder Alloy Containing Ge But Not Containing Mn (Comparison Examples)

In the Sn-based solder alloy containing Ge but not containing Mn, $O_2$ in the air and Sn and Ge in the solder alloy react in an initial state of the production process of the oxides to produce an oxide film by Sn oxides ($SnO_x$) and Ge oxides ($GeO_z$) on a surface of the solder alloy.

When exposing the solder alloy on which the oxide film has been formed in such an initial state under the high temperature environment or the high temperature and high humidity environment, it is conceivable that a part of the oxide film formed on the surface is destroyed.

Accordingly, in Sn-based solder alloy containing Ge but not containing Mn, it is impossible to suppress the discoloration of the oxide film by the growth of Sn oxides.

EXECUTED EXAMPLES

Evaluation of Discoloration Prevention Effect

The solder alloys of the Executed examples were prepared according to the compositions indicated in following Table 1, the solder alloys of the comparison examples were prepared according to the compositions indicated in Table 2, and the solder alloys of the reference examples were prepared according to the compositions indicated in Table 3, so that they were inspected about the discoloration prevention effect. It is to be noted that a composition percentages indicated in Tables 1, 2 and 3 are indicated by % by mass.

The evaluation of discoloration prevention effect was performed according to the following procedure.

(1) Manufacture of Specimens

The prepared solder alloys were casted and rolled to form plate materials. These plate materials were punched out into small pieces (each being 2 mm long by 2 mm broad by 0.1 mm thick) which were made specimens.

(2) Inspection Method

Respective specimens thus prepared of the Executed Examples, the Comparison Examples and the Reference Examples were stored under the high temperature environment and the high temperature and high humidity environment and they were inspected on whether or not they were discolored. The storage condition is such that the specimens were stayed for 24 hours at the temperature of 125 degrees C. and the humidity of 100% RH in a case of the high temperature and high humidity environment. They were exposed for 7 days at the temperature of 150 degrees C. in a case of the high temperature exposure environment. The discoloration was certified using DIGITAL MICROSCOPE VHX-500F made by KEYENCE. As a confirmation result, a case where any discoloration was not seen was evaluated as a double circle; a case where some change was confirmed in gloss was evaluated as a circle; a case where any slight discoloration was seen was evaluated as a triangle; and a case where there was a discoloration was evaluated as a cross.

TABLE 1

| | Sn | Ag | Cu | Ge | Mn | P | Ga | Ni | Co | Fe | Bi | In | Sb | INITIAL STATE | HIGH TEMPERATURE AND HIGH HUMIDITY | HIGH TEMPERATURE EXPOSURE | WETTABILITY [mm²] Cu-OSP | WETTABILITY [mm²] Ni/Au | FUSION FAILURE INCIDENCE [%] |
|---|---|---|---|---|---|---|---|---|---|---|---|---|---|---|---|---|---|---|---|
| EXECUTED EXAMPLE 1 | Bal. | 0 | 0.5 | 0.05 | 0.05 | | | | | | | | | ◎ | ◎ | ◎ | 5.2 | 12.0 | 0 |
| EXECUTED EXAMPLE 2 | Bal. | 0 | 0.5 | 0.1 | 0.1 | | | | | | | | | ◎ | ◎ | ◎ | 5.2 | 12.1 | 0 |
| EXECUTED EXAMPLE 3 | Bal. | 0 | 1 | 0.05 | 0.05 | | | | | | | | | ◎ | ◎ | ◎ | 5.1 | 11.9 | 0 |
| EXECUTED EXAMPLE 4 | Bal. | 0 | 0.5 | 0.001 | 0.005 | | | | | | | | | ◎ | ○ | ○ | 5.3 | 12.3 | 0 |
| EXECUTED EXAMPLE 5 | Bal. | 2 | 0 | 0.05 | 0.05 | | | | | | | | | ◎ | ◎ | ◎ | 5.7 | 12.2 | 0 |
| EXECUTED EXAMPLE 6 | Bal. | 2 | 0 | 0.1 | 0.1 | | | | | | | | | ◎ | ◎ | ◎ | 5.6 | 12.2 | 0 |
| EXECUTED EXAMPLE 7 | Bal. | 4 | 0 | 0.05 | 0.05 | | | | | | | | | ◎ | ◎ | ◎ | 5.8 | 12.4 | 0 |
| EXECUTED EXAMPLE 8 | Bal. | 2 | 0 | 0.001 | 0.005 | | | | | | | | | ◎ | ○ | ○ | 6.0 | 12.4 | 0 |
| EXECUTED EXAMPLE 9 | Bal. | 0 | 0.5 | 0.05 | 0.05 | 0.04 | | | | | | | | ◎ | ◎ | ◎ | 5.3 | 11.9 | 0 |
| EXECUTED EXAMPLE 10 | Bal. | 0 | 0.5 | 0.05 | 0.05 | | 0.05 | | | | | | | ◎ | | | | | |
| EXECUTED EXAMPLE 11 | Bal. | 0 | 0.5 | 0.05 | 0.05 | | | 0.11 | | | | | | ◎ | | | | | |
| EXECUTED EXAMPLE 12 | Bal. | 0 | 1 | 0.05 | 0.05 | | | | 0.10 | | | | | ◎ | | | | | |
| EXECUTED EXAMPLE 13 | Bal. | 0 | 0.5 | 0.05 | 0.05 | | | | | 0.13 | | | | ◎ | | | | | |
| EXECUTED EXAMPLE 14 | Bal. | 0 | 0.7 | 0.05 | 0.05 | | | | | | 3.0 | | | ◎ | | | | | |
| EXECUTED EXAMPLE 15 | Bal. | 0 | 0.7 | 0.05 | 0.05 | | | | | | | 3.1 | | ◎ | | | | | |
| EXECUTED EXAMPLE 16 | Bal. | 0 | 0.7 | 0.05 | 0.05 | | | | | | | | 3.0 | ◎ | | | | | |
| EXECUTED EXAMPLE 17 | Bal. | 2 | 0 | 0.05 | 0.05 | 0.04 | | | | | | | | ◎ | | | | | |
| EXECUTED EXAMPLE 18 | Bal. | 2 | 0 | 0.05 | 0.05 | | 0.05 | | | | | | | ◎ | | | | | |
| EXECUTED EXAMPLE 19 | Bal. | 2 | 0 | 0.05 | 0.05 | | | 0.10 | | | | | | ◎ | | | | | |
| EXECUTED EXAMPLE 20 | Bal. | 2 | 0 | 0.05 | 0.05 | | | | 0.12 | | | | | ◎ | | | | | |
| EXECUTED EXAMPLE 21 | Bal. | 2 | 0 | 0.05 | 0.05 | | | | | 0.12 | | | | ◎ | | | | | |
| EXECUTED EXAMPLE 22 | Bal. | 2 | 0 | 0.05 | 0.05 | | | | | | 3.1 | | | ◎ | | | | | |
| EXECUTED EXAMPLE 23 | Bal. | 2 | 0 | 0.05 | 0.05 | | | | | | | 3.0 | | ◎ | | | | | |
| EXECUTED EXAMPLE 24 | Bal. | 2 | 0 | 0.05 | 0.05 | | | | | | | | 3.0 | ◎ | | | | | |
| EXECUTED EXAMPLE 25 | Bal. | 0 | 0.5 | 0.05 | 0.05 | 0.04 | 0.05 | 0.11 | 0.1 | 0.11 | 3.1 | 3.2 | 3.0 | ◎ | | | | | |
| EXECUTED EXAMPLE 26 | Bal. | 1 | 0 | 0.05 | 0.05 | 0.04 | 0.05 | 0.1 | 0.1 | 0.11 | 3.1 | 3.2 | 3.1 | ◎ | | | | | |

TABLE 1-continued

| | | | | | |
|---|---|---|---|---|---|
| EXECUTED EXAMPLE 10 | ◉ | ◉ | 5.0 | 11.9 | 0 |
| EXECUTED EXAMPLE 11 | ◉ | ◉ | 5.1 | 12.1 | 0 |
| EXECUTED EXAMPLE 12 | ◉ | ◉ | 5.2 | 11.7 | 0 |
| EXECUTED EXAMPLE 13 | ◉ | ◉ | 5.1 | 11.9 | 0 |
| EXECUTED EXAMPLE 14 | ◉ | ◉ | 5.8 | 12.5 | 0 |
| EXECUTED EXAMPLE 15 | ◉ | ◉ | 5.3 | 12.2 | 0 |
| EXECUTED EXAMPLE 16 | ◉ | ◉ | 5.6 | 12.4 | 0 |
| EXECUTED EXAMPLE 17 | ◉ | ◉ | 5.7 | 12.3 | 0 |
| EXECUTED EXAMPLE 18 | ◉ | ◉ | 5.6 | 12.3 | 0 |
| EXECUTED EXAMPLE 19 | ◉ | ◉ | 5.4 | 12.1 | 0 |
| EXECUTED EXAMPLE 20 | ◉ | ◉ | 5.5 | 12.2 | 0 |
| EXECUTED EXAMPLE 21 | ◉ | ◉ | 5.6 | 12.0 | 0 |
| EXECUTED EXAMPLE 22 | ◉ | ◉ | 5.9 | 12.5 | 0 |
| EXECUTED EXAMPLE 23 | ◉ | ◉ | 5.5 | 12.1 | 0 |
| EXECUTED EXAMPLE 24 | ◉ | ◉ | 5.4 | 12.3 | 0 |
| EXECUTED EXAMPLE 25 | ◉ | ◉ | 5.2 | 12.5 | 0 |
| EXECUTED EXAMPLE 26 | ◉ | ◉ | 5.4 | 12.6 | 0 |

TABLE 2

| | Sn | Ag | Cu | Ge | Mn | P | Ga | Ni | Co | Fe | Bi | In | Sb | INITIAL STATE |
|---|---|---|---|---|---|---|---|---|---|---|---|---|---|---|
| COMPARISON EXAMPLE 1 | 100 | 0 | 0 | 0 | 0 | | | | | | | | | ◉ |
| COMPARISON EXAMPLE 2 | Bal. | 1.0 | 0.7 | 0 | 0 | | | | | | | | | ◉ |
| COMPARISON EXAMPLE 3 | Bal. | 0 | 0 | 0 | 0.005 | | | | | | | | | ◉ |
| COMPARISON EXAMPLE 4 | Bal. | 0 | 0 | 0 | 0.06 | | | | | | | | | ◉ |
| COMPARISON EXAMPLE 5 | Bal. | 0 | 0 | 0 | 0.1 | | | | | | | | | ◉ |
| COMPARISON EXAMPLE 6 | Bal. | 0 | 0 | 0 | 0.14 | | | | | | | | | ◉ |
| COMPARISON EXAMPLE 7 | Bal. | 0 | 0 | 0 | 0.19 | | | | | | | | | ◉ |
| COMPARISON EXAMPLE 8 | Bal. | 0 | 0 | 0.001 | 0 | | | | | | | | | ◉ |
| COMPARISON EXAMPLE 9 | Bal. | 0 | 0 | 0.001 | 0.14 | | | | | | | | | ◉ |
| COMPARISON EXAMPLE 10 | Bal. | 0 | 0 | 0.05 | 0 | | | | | | | | | ◉ |
| COMPARISON EXAMPLE 11 | Bal. | 0 | 0 | 0.05 | 0.15 | | | | | | | | | ◉ |
| COMPARISON EXAMPLE 12 | Bal. | 0 | 0 | 0.1 | 0 | | | | | | | | | ◉ |
| COMPARISON EXAMPLE 13 | Bal. | 0 | 0 | 0.1 | 0.15 | | | | | | | | | ◉ |
| COMPARISON EXAMPLE 14 | Bal. | 0 | 0 | 0.15 | 0.005 | | | | | | | | | ◉ |
| COMPARISON EXAMPLE 15 | Bal. | 0 | 0 | 0.15 | 0.05 | | | | | | | | | ◉ |
| COMPARISON EXAMPLE 16 | Bal. | 0 | 0 | 0.15 | 0.1 | | | | | | | | | ◉ |
| COMPARISON EXAMPLE 17 | Bal. | 0 | 0 | 0.15 | 0.15 | | | | | | | | | ◉ |
| COMPARISON EXAMPLE 18 | Bal. | 2 | 0.5 | 0.15 | 0.15 | | | | | | | | | ◉ |

TABLE 2-continued

| | Sn | Ag | Cu | Ge | Mn | ... | INITIAL STATE |
|---|---|---|---|---|---|---|---|
| COMPARISON EXAMPLE 19 | Bal. | 0 | 2 | 0.15 | 0.15 | | ⊚ |
| COMPARISON EXAMPLE 20 | Bal. | 4.5 | 0 | 0.15 | 0.15 | | ⊚ |

| | HIGH TEMPERATURE AND HIGH HUMDITY | HIGH TEMPERATURE EXPOSURE | WETTABILITY [mm²] | | FUSION FAILURE INCIDENCE [%] |
|---|---|---|---|---|---|
| | | | Cu-OSP | Ni/Au | |
| COMPARISON EXAMPLE 1 | X | X | 3.9 | 10.1 | 24.4 |
| COMPARISON EXAMPLE 2 | X | X | 4.2 | 10.8 | 15.6 |
| COMPARISON EXAMPLE 3 | X | X | 4.6 | 10.5 | 20.0 |
| COMPARISON EXAMPLE 4 | X | X | 4.5 | 10.5 | 11.1 |
| COMPARISON EXAMPLE 5 | X | X | 4.4 | 10.3 | 13.3 |
| COMPARISON EXAMPLE 6 | X | X | 4.1 | 10.0 | 26.7 |
| COMPARISON EXAMPLE 7 | X | X | 4.1 | 10.3 | 31.1 |
| COMPARISON EXAMPLE 8 | X | Δ | 4.3 | 10.4 | 17.8 |
| COMPARISON EXAMPLE 9 | ○ | ○ | 4.7 | 10.2 | 6.67 |
| COMPARISON EXAMPLE 10 | X | ⊚ | 4.4 | 10.8 | 26.7 |
| COMPARISON EXAMPLE 11 | ⊚ | ⊚ | 4.6 | 11.1 | 11.1 |
| COMPARISON EXAMPLE 12 | X | ⊚ | 4.5 | 10.9 | 15.6 |
| COMPARISON EXAMPLE 13 | ⊚ | ⊚ | 4.2 | 10.7 | 6.67 |
| COMPARISON EXAMPLE 14 | ⊚ | ⊚ | 4.2 | 10.8 | 6.67 |
| COMPARISON EXAMPLE 15 | ⊚ | ⊚ | 4.3 | 10.8 | 11.1 |
| COMPARISON EXAMPLE 16 | ⊚ | ⊚ | 4.3 | 10.3 | 13.3 |
| COMPARISON EXAMPLE 17 | ⊚ | ⊚ | 4.0 | 10.1 | 17.8 |
| COMPARISON EXAMPLE 18 | ⊚ | ⊚ | 4.4 | 10.6 | 20.0 |
| COMPARISON EXAMPLE 19 | ⊚ | ⊚ | 3.9 | 9.9 | 24.4 |
| COMPARISON EXAMPLE 20 | ⊚ | ⊚ | 4.3 | 10.1 | 17.8 |

TABLE 3

| | Sn | Ag | Cu | Ge | Mn | P | Ga | Ni | Co | Fe | Bi | In | Sb | INITIAL STATE |
|---|---|---|---|---|---|---|---|---|---|---|---|---|---|---|
| REFERENCE EXAMPLE 1 | Bal. | 0 | 0 | 0.001 | 0.005 | | | | | | | | | ⊚ |
| REFERENCE EXAMPLE 2 | Bal. | 0 | 0 | 0.001 | 0.04 | | | | | | | | | ⊚ |
| REFERENCE EXAMPLE 3 | Bal. | 0 | 0 | 0.001 | 0.1 | | | | | | | | | ⊚ |
| REFERENCE EXAMPLE 4 | Bal. | 0 | 0 | 0.05 | 0.005 | | | | | | | | | ⊚ |
| REFERENCE EXAMPLE 5 | Bal. | 0 | 0 | 0.05 | 0.05 | | | | | | | | | ⊚ |
| REFERENCE EXAMPLE 6 | Bal. | 0 | 0 | 0.05 | 0.1 | | | | | | | | | ⊚ |
| REFERENCE EXAMPLE 7 | Bal. | 0 | 0 | 0.1 | 0.005 | | | | | | | | | ⊚ |
| REFERENCE EXAMPLE 8 | Bal. | 0 | 0 | 0.1 | 0.05 | | | | | | | | | ⊚ |
| REFERENCE EXAMPLE 9 | Bal. | 0 | 0 | 0.1 | 0.1 | | | | | | | | | ⊚ |
| REFERENCE EXAMPLE 10 | Bal. | 2 | 0.5 | 0.001 | 0.005 | | | | | | | | | ⊚ |

TABLE 3-continued

| | | | | | | | | | | | | | | |
|---|---|---|---|---|---|---|---|---|---|---|---|---|---|---|
| REFERENCE EXAMPLE 11 | Bal. | 2 | 0.5 | 0.05 | 0.05 | | | | | | | | | ⊚ |
| REFERENCE EXAMPLE 12 | Bal. | 2 | 0.5 | 0.1 | 0.1 | | | | | | | | | ⊚ |
| REFERENCE EXAMPLE 13 | Bal. | 4 | 1 | 0.05 | 0.05 | | | | | | | | | ⊚ |
| REFERENCE EXAMPLE 14 | Bal. | 0 | 0 | 0.05 | 0.05 | 0.05 | | | | | | | | ⊚ |
| REFERENCE EXAMPLE 15 | Bal. | 0 | 0 | 0.05 | 0.05 | | 0.05 | | | | | | | ⊚ |
| REFERENCE EXAMPLE 16 | Bal. | 0 | 0 | 0.05 | 0.05 | | | 0.13 | | | | | | ⊚ |
| REFERENCE EXAMPLE 17 | Bal. | 0 | 0 | 0.05 | 0.05 | | | | 0.11 | | | | | ⊚ |
| REFERENCE EXAMPLE 18 | Bal. | 0 | 0 | 0.05 | 0.05 | | | | | 0.13 | | | | ⊚ |
| REFERENCE EXAMPLE 19 | Bal. | 0 | 0 | 0.05 | 0.05 | | | | | | 3.1 | | | ⊚ |
| REFERENCE EXAMPLE 20 | Bal. | 0 | 0 | 0.05 | 0.05 | | | | | | | 3.2 | | ⊚ |
| REFERENCE EXAMPLE 21 | Bal. | 0 | 0 | 0.05 | 0.05 | | | | | | | | 3.0 | ⊚ |
| REFERENCE EXAMPLE 22 | Bal. | 0 | 0 | 0.05 | 0.05 | 0.05 | 0.05 | 0.12 | 0.09 | 0.11 | 3.3 | 3.1 | 3.0 | ⊚ |

| | HIGH TEMPERATURE AND HIGH HUMDITY | HIGH TEMPERATURE EXPOSURE | WETTABILITY [mm²] | | FUSION FAILURE INCIDENCE [%] |
|---|---|---|---|---|---|
| | | | Cu-OSP | Ni/Au | |
| REFERENCE EXAMPLE 1 | ○ | ○ | 5.9 | 12.1 | 0 |
| REFERENCE EXAMPLE 2 | ○ | ○ | 5.7 | 11.9 | 0 |
| REFERENCE EXAMPLE 3 | ○ | ○ | 5.5 | 11.6 | 0 |
| REFERENCE EXAMPLE 4 | ⊚ | ⊚ | 5.8 | 11.9 | 0 |
| REFERENCE EXAMPLE 5 | ⊚ | ⊚ | 5.4 | 12.0 | 0 |
| REFERENCE EXAMPLE 6 | ○ | ○ | 5.5 | 11.4 | 0 |
| REFERENCE EXAMPLE 7 | ⊚ | ⊚ | 5.4 | 11.8 | 0 |
| REFERENCE EXAMPLE 8 | ⊚ | ⊚ | 5.5 | 12.0 | 0 |
| REFERENCE EXAMPLE 9 | ⊚ | ⊚ | 5.2 | 12.1 | 0 |
| REFERENCE EXAMPLE 10 | ○ | ○ | 5.8 | 12.6 | 0 |
| REFERENCE EXAMPLE 11 | ⊚ | ⊚ | 5.7 | 12.2 | 0 |
| REFERENCE EXAMPLE 12 | ⊚ | ⊚ | 5.4 | 12.3 | 0 |
| REFERENCE EXAMPLE 13 | ⊚ | ⊚ | 5.1 | 12.0 | 0 |
| REFERENCE EXAMPLE 14 | ⊚ | ⊚ | 5.4 | 11.8 | 0 |
| REFERENCE EXAMPLE 15 | ⊚ | ⊚ | 5.2 | 11.9 | 0 |
| REFERENCE EXAMPLE 16 | ⊚ | ⊚ | 5.1 | 12.2 | 0 |
| REFERENCE EXAMPLE 17 | ⊚ | ⊚ | 5.2 | 12.0 | 0 |
| REFERENCE EXAMPLE 18 | ⊚ | ⊚ | 5.1 | 11.7 | 0 |
| REFERENCE EXAMPLE 19 | ⊚ | ⊚ | 5.9 | 12.8 | 0 |
| REFERENCE EXAMPLE 20 | ⊚ | ⊚ | 5.2 | 12.3 | 0 |
| REFERENCE EXAMPLE 21 | ⊚ | ⊚ | 5.1 | 12.2 | 0 |
| REFERENCE EXAMPLE 22 | ⊚ | ⊚ | 5.3 | 12.8 | 0 |

As shown in Tables 1, 2 and 3, any discoloration was not seen in the initial state of all of the Executed Examples, the Comparison Examples and the Reference Examples. In the Executed Examples in which 0.005% by mass or more and 0.1% by mass or less of Mn, 0.001% by mass or more and 0.1% by mass or less of Ge, more than 0% by mass and 1% by mass or less of Cu or more than 0% by mass and 4% by mass or less of Ag, and remainder of Sn were contained, any discoloration was not seen under both of the high temperature and high humidity environment and the high temperature exposure environment in the Executed Examples 1, 2, 5 and 6 in which Mn contents percentage and Ge contents percentage were the same percentages.

In the Executed Example 3 in which Mn contents and Ge contents were the same percentage and Cu contents were increased within a predetermined range, any discoloration was not seen similarly under both of the high temperature and high humidity environment and the high temperature exposure environment, so that it has been understood that any discoloration prevention effect is not inhibited when Cu contents are 1% by mass or less. In addition, in the Executed Example 7 in which Ag contents were increased within a predetermined range, any discoloration was not seen similarly under both of the high temperature and high humidity environment and the high temperature exposure environment, so that it has been understood that discoloration prevention effect is not inhibited when Ag contents are 4% by mass or less. In the Executed Examples 4 and 8 in which Mn contents percentage was more than Ge contents percentage (Mn>Ge), some change was confirmed in gloss under the high temperature and high humidity environment and the high temperature exposure.

In the Reference Examples in which the above predetermined amount of Mn and Ge and remainder of Sn were contained, any discoloration was not seen under both of the high temperature and high humidity environment and the high temperature exposure environment in the Reference Examples 5 and 9 in which Mn contents percentages and Ge contents percentages were the same percentages. On the other hand, in the Reference Examples 1 through 3 and 6 in which Mn contents percentages were more than Ge contents percentages (Mn>Ge), some change was confirmed in gloss under the high temperature and high humidity environment and the high temperature exposure. In contrast, in the Reference Examples 4, 7 and 8 in which Ge contents percentages were more than Mn contents percentages (Ge>Mn), any discoloration was not seen under both of the high temperature and high humidity environment and the high temperature exposure environment.

In addition, in the Reference Examples in which predetermined amounts of Mn and Ge were contained, Cu and Ag were further contained and the remainder was Sn, some change was confirmed in gloss under the high temperature and high humidity environment and the high temperature exposure in the Reference Example 10 in which Mn contents percentage was more than Ge contents percentage (Mn>Ge). On the other hand, in the Reference Examples 11 and 12 in which Mn contents percentages and Ge contents percentages were the same percentages, any discoloration was not seen under both of the high temperature and high humidity environment and the high temperature exposure environment.

Further, in the Reference Example 13 in which Mn contents percentage and Ge contents percentage are the same percentage and contents of Ag and Cu were increased within a predetermined range, any discoloration was not seen similarly under both of the high temperature and high humidity environment and the high temperature exposure environment, so that it has been understood that any discoloration prevention effect is not inhibited when Ag contents are 4% by mass or less and Cu contents are 1% by mass or less, even when ag and Cu are contained.

Thus, it has been understood that in all of a case where Cu or Ag is contained, a case where Cu and Ag are not contained, and a case where Cu and Ag are contained, the similar trend exhibits in the discolor prevention effect when predetermined amounts of Mn and Ge are contained in the solder alloy having the principal ingredient of Sn. Particularly, when Ge contents percentage is equal to or more than Mn contents percentage (Mn<=Ge), it has been understood that any discoloration can be suppressed under both of the high temperature and high humidity environment and the high temperature exposure environment.

In the Executed Examples 9 through 26 in which predetermined amounts of Mn and Ge were contained, Cu or Ag was further contained, Mn contents percentages and Ge contents percentages were the same percentages, any or all of P, Ga, Ni, Co, Fe, Bi, In and Sb were contained and the remainder was Sn, any discoloration was not seen under both of the high temperature and high humidity environment and the high temperature exposure environment.

In the Reference Examples 14 through 22 in which predetermined amounts of Mn and Ge were contained, Mn contents percentages and Ge contents percentages were the same percentages, any or all of P, Ga, Ni, Co, Fe, Bi, In and Sb were contained and the remainder was Sn, any discoloration was not seen similarly under both of the high temperature and high humidity environment and the high temperature exposure environment.

In contrast, in the Comparison Example 1 in which Mn and Ge were not contained and pure Sn was contained, and the Comparison Example 2 in which Mn and Ge were not contained but Ag and Cu were contained and the remainder was Sn, discoloration was seen under both of the high temperature and high humidity environment and the high temperature exposure environment. In the Comparison Examples 3 through 7 in which Mn was contained but Ge was not contained, discoloration was seen similarly under both of the high temperature and high humidity environment and the high temperature exposure environment. In the Comparison Examples 8, 10 and 12 in which Ge was contained but Mn was not contained, the discoloration prevention effect was acquired under the high temperature exposure by increasing Ge contents but discoloration was seen under the high temperature and high humidity environment. In the Comparison Examples 9, 11 and 13 through 20 in which Ge and Mn were contained, some change was confirmed in gloss in the Comparison Example 9 even when any or both of Mn and Ge were excessively contained over the range of this invention, but any discoloration was not seen under both of the high temperature and high humidity environment and the high temperature exposure environment in the Comparison Examples 11 and 13 through 20.

From the above results, it has been understood that the discoloration prevention effect is acquired under both of the high temperature and high humidity environment and the high temperature exposure environment by containing predetermined amounts of Mn and Ge and further Cu or Ag in the solder ally having the principal ingredient of Sn and it has been understood that the better discoloration prevention effect is acquired when Ge contents percentage is equal to or more than Mn contents percentage (Mn<=Ge).

Distribution of Oxides

Next, in connection with the solder alloys of the Executed Examples shown in the above-mentioned Table 1, which were evaluated on the discoloration prevention effect under the high temperature and high humidity environment and the high temperature exposure environment, a distribution of Sn oxides, Mn oxides and Ge oxides in the oxide film was inspected.

FIG. 1 shows the distribution of principal elements in a case of having the principal ingredient of Sn and containing Mn and Ge. In a graph of FIG. 1, a vertical axis represents contents and a horizontal axis represents a depth from the outermost surface in which the elements are distributed. It is to be noted that other content elements such as oxygen, carbon or the like are not shown in the drawing.

It has been understood that in the Reference Example 1 having the principal ingredient of Sn and containing Mn and Ge, most Ge oxides are distributed within a range of around 10 nm from the outermost surface of the oxide film and it has been also understood that most Ge oxides are distributed in the outermost surface side of the oxide film. In addition, it has been understood that Mn is almost evenly distributed from the outermost surface. In contrast, it has been understood that Sn decreases at the outermost surface. Moreover, in each of the Executed Examples 1 through 26 having the principal ingredient of Sn and containing Mn and Ge and further Ag or Cu, a similar distribution indicates.

From the distribution of elements sown in FIG. 1, it has been understood that in the solder alloy having the principal ingredient of Sn and containing predetermined amounts of Mn and Ge, Ge oxides are unevenly distributed to the outermost surface side of the oxide film, thereby suppressing the production of Sn oxides on the outermost surface.

Thus, the discoloration is suppressed by allowing Ge oxides having the discoloration prevention effect to be distributed to the outermost surface side. Since Mn oxides are almost evenly distributed to a thickness direction of the oxide film, the production of Sn oxides is suppressed.

Evaluation of Fusion Property

In connection with the solder alloys of each of the Executed Examples, the Comparison Examples and the Reference Examples shown in the above-mentioned Tables 1, 2 and 3, which were evaluated on the discoloration prevention effect under the high temperature and high humidity environment and the high temperature exposure environment, fusion properties were inspected. According to an inspection method, the solder alloys prepared based on compositions of the Executed Examples, the Comparison Examples and the Reference Examples were casted and rolled and were punched out into small pieces (each being 2 mm long by 2 mm broad by 0.1 mm thick). These small pieces were molded to form plates, each having a predetermined dimension, which were mounted on Cu plate on which organic solderability preservative (OSP) processing had been performed and to which a flux is applied. They were reflowed and then, their surface were washed and stayed at an environment of temperature of 125 degrees C. and the humidity of 100% RH for 24 hours. Solder balls (having a diameter of 300 μm in this example) manufactured using a solder alloy (Sn-3.0Ag-0.5Cu) in which Ag was 3.0% by mass, Cu was 0.5% by mass and the remainder was Sn, were stayed at an environment of temperature of 125 degrees C. and the humidity of 100% RH for 24 hours like the small pieces. Next, a flux was applied on each specimen made of the solder alloys of the Executed Examples, the Comparison Examples and the Reference Examples and a predetermined number of the solder balls were mounted thereon. In this example, the number of the solder balls was set to be nine and respective 5 pieces were prepared. They were reflowed and then, the number of fusion failed balls was count and fusion failure incidence was calculated. The fusion failed ball is referred to as a state where the Cu plate and the solder ball are not joined to each other.

In the Executed Examples 1 through 8 in which predetermined amounts of Mn and Ge were contained, Cu or Ag was further contained and the remainder was Sn, the fusion failure incidence was zero. Particularly, in the Executed Example 3 in which Cu contents were increased within a predetermined range, the fusion failure incidence was zero, so that it has been understood that the fusion is not inhibited when Cu contents are 1% by mass or less. In addition, in the Executed Example 7 in which Ag contents were increased within a predetermined range, the fusion failure incidence was zero, so that it has been understood that the fusion is not inhibited when Ag contents are 4% by mass or less.

Further, in the Executed Examples 9 through 26 in which predetermined amounts of Mn and Ge were contained, Cu or Ag was further contained, any or all of P, Ga, Ni, Co, Fe, Bi, In and Sb were contained and the remainder was Sn, the fusion failure incidence was zero.

Additionally, in the Reference Examples 1 through 9 in which predetermined amounts of Mn and Ge were contained and the remainder was Sn, and in the Reference Examples 10 through 13 in which predetermined amounts of Mn and Ge were contained, Cu and Ag were further contained and the remainder was Sn, the fusion failure incidence was zero.

In addition, in the Reference Examples 14 through 22 in which predetermined amounts of Mn and Ge were contained, any or all of P, Ga, Ni, Co, Fe, Bi, In and Sb were contained and the remainder was Sn, the fusion failure incidence was zero.

In all of the Comparison Example 1 in which Mn and Ge were not contained and pure Sn was contained, the Comparison Example 2 in which Mn and Ge were not contained but Ag and Cu were contained and the remainder was Sn, the Comparison Examples 3 through 7 having the principal ingredient of Sn and containing Mn but not containing Ge, and the Comparison Examples 8, 10 and 12 having the principal ingredient of Sn and containing Ge but not containing Mn, the fusion failure occurred. In addition, in the comparison Examples 9, 11 and 13 through 18 containing Mn and Ge, the fusion failure occurred in either of the Comparison Examples 9, 11 and 13 excessively containing Mn over the range of this invention or the Comparison Examples 14 through 18 excessively containing Ge or both of Mn and Ge over the range of this invention. Further, in the comparison Example 19 excessively containing both of Mn and Ge over the range of this invention and further excessively containing Cu over the range of this invention, and the comparison Example 20 excessively containing both of Mn and Ge over the range of this invention and further excessively containing Ag over the range of this invention, the fusion failure occurred.

Evaluation of Wettability

In connection with the solder alloys of each of the Executed Examples, the Comparison Examples and the Reference Examples shown in the above-mentioned Tables 1, 2 and 3, which were evaluated on the discoloration prevention effect under the high temperature and high humidity environment and the high temperature exposure environment, wettability was inspected. According to an inspection method, the solder alloys prepared based on compositions of the Executed Examples, the Comparison Examples and the Reference Examples were casted and rolled and were punched out into small pieces (each being 2 mm long by 2 mm broad by 0.1 mm thick). These small pieces were stayed at an environment of temperature of 125 degrees C and the humidity of 100% RH for 24 hours. Next, fluxes were applied on respective plates of Cu plate on which OSP processing had been performed and Ni/Au plated plate in which Ni plating was performed on Cu plate and Au plating was further performed on Ni plating plate and the small pieces which had been processed under the high temperature and high humidity were mounted on the plates and they were reflowed. An area in which the solder alloy spread out was measured and it was set to be success when it spread out over 5.0 mm$^2$ in a case of OSP processed Cu plate or it spread out over 11.0 mm$^2$ in a case of Ni/Au plated plate.

In the Executed Examples 1 through 8 in which predetermined amounts of Mn and Ge were contained, Cu or Ag was further contained and the remainder was Sn, any deterioration in the wettability to both of the OSP processed Cu plate and the Ni/Au plated plate was not seen.

Particularly, in the Executed Example 3 in which Cu contents were increased within a predetermined range, any deterioration in the wettability to both of the OSP processed Cu plate and the Ni/Au plated plate was not seen, so that it has been understood that the wettability is not inhibited when Cu contents are 1% by mass or less.

In addition, in the Executed Example 7 in which Ag contents were increased within a predetermined range, any deterioration in the wettability to both of the OSP processed Cu plate and the Ni/Au plated plate was not seen, so that it has been understood that the wettability is not inhibited when Ag contents are 4% by mass or less.

Further, in the Executed Examples 9 through 26 in which predetermined amounts of Mn and Ge were contained, Cu or Ag was further contained, any or all of P, Ga, Ni, Co, Fe, Bi, In and Sb were contained and the remainder was Sn, any deterioration in the wettability to both of the OSP processed Cu plate and the Ni/Au plated plate was not seen.

Additionally, in the Reference Examples 1 through 9 in which predetermined amounts of Mn and Ge were contained and the remainder was Sn, and the Reference Examples 10 through 13 in which predetermined amounts of Mn and Ge were contained, Cu and Ag were further contained and the remainder was Sn, any deterioration in the wettability to both of the OSP processed Cu plate and the Ni/Au plated plate was not seen.

In addition, in the Reference Examples 14 through 22 in which predetermined amounts of Mn and Ge were contained, any or all of P, Ga, Ni, Co, Fe, Bi, In and Sb were further contained and the remainder was Sn, any deterioration in the wettability to both of the OSP processed Cu plate and the Ni/Au plated plate was not seen.

In the Comparison Example 1 in which Mn and Ge were not contained and pure Sn was contained, and the Comparison Example 2 in which Mn and Ge were not contained but Ag and Cu were contained and the remainder was Sn, the wettability to both of the OSP processed Cu plate and the Ni/Au plated plate deteriorated.

In the Comparison Examples 3 through 7 containing Mn but not containing Ge, the wettability to both of the OSP processed Cu plate and the Ni/Au plated plate deteriorated when Mn contents were increased. In the comparison Examples 9, 11 and 13 through 18 containing Mn and Ge, the wettability to both of the OSP processed Cu plate and the Ni/Au plated plate deteriorated in all of the Comparison Examples 9, 11 and 13 excessively containing Mn over the range of this invention and the Comparison Examples 14 through 18 excessively containing Ge or both of Mn and Ge over the range of this invention.

Further, in the comparison Example 19 excessively containing both of Mn and Ge over the range of this invention and further excessively containing Cu over the range of this invention, and the comparison Example 20 excessively containing both of Mn and Ge over the range of this invention and further excessively containing Ag over the range of this invention, the wettability to both of the OSP processed Cu plate and the Ni/Au plated plate deteriorated. It has been understood that the wettability deteriorates when containing Mn and/or Ge over the range of this invention.

From the above results, it has been understood that in the solder alloy having the principal ingredient of Sn and containing 0.005% by mass or more and 0.1% by mass or less of Mn, 0.001% by mass or more and 0.1% by mass or less of Ge and more than 0% by mass and 4% by mass or less of Ag, Mn and $O_2$ react to suppress reaction of Sn and $O_2$ and the distribution of Sn oxides to the outermost surface of the oxide film by change with time is suppressed, and that by allowing the oxide film containing Ge oxides, which has discoloration prevention effect, to remain in the outermost surface side, the discoloration prevention effect is acquired even under the high temperature and high humidity environment. Preferably, when Ge contents percentage is equal to or more than Mn contents percentage (Mn<=Ge), it has been understood that the good discoloration prevention effect is acquired under both of the high temperature and high humidity environment and the high temperature exposure environment.

In addition, in the solder alloy having the principal ingredient of Sn and containing the above-mentioned predetermined amounts of Mn and Ge and further Ag, it has been understood that since Mn and $O_2$ react to suppress reaction of Sn and $O_2$ so that a growth of Sn oxides is suppressed, it is possible to suppress an increase in the thickness of the oxide film. The suppression of the increase in the thickness of the oxide film enables the flux to sufficiently remove oxides during soldering, thereby improving the fusion properties thereof.

Application Examples of Solder Alloy

FIG. 2 is a configuration diagram showing an example to which the solder alloy according to the invention is applied. The solder alloy having the principal ingredient of Sn and containing 0.005% by mass or more and 0.1% by mass or less of Mn, 0.001% by mass or more and 0.1% by mass or less of Ge and more than 0% by mass and 4% by mass or less of Ag may be formed as spherical solder ball 10. A diameter of the solder ball 10 is preferably 1 through 1000 μm. When it stays within this range, the spherical solder ball can be stably manufactured and it is possible to suppress any connection short circuit between terminals when they have narrow pitches. Here, when the diameter of the solder ball is around 1 through 50 μm, it may be referred to as "solder powder".

FIG. 3 is a configuration diagram showing another example to which the solder alloy according to the invention is applied. The solder alloy having the principal ingredient of Sn and containing 0.005% by mass or more and 0.1% by mass or less of Mn, 0.001% by mass or more and 0.1% by mass or less of Ge and more than 0% by mass and 4% by mass or less of Ag may be formed as a chip solder 11. The chip solder 11 is configured to be formed as, for example, a rectangular parallelepiped.

As another application example, the solder alloy having the principal ingredient of Sn and containing 0.005% by mass or more and 0.1% by mass or less of Mn, 0.001% by mass or more and 0.1% by mass or less of Ge and more than 0% by mass and 4% by mass or less of Ag may be formed as powder having a predetermined size which is mixed with a flux to form a solder paste.

The solder alloy, the solder ball, the chip solder, the solder paste according to this invention form a solder joint which is used for joining semiconductor chips or for joining electronic components with a printed circuit board.

In this invention, alpha dose may be 0.0200 cph/cm$^2$ or less. When the alpha dose is 0.0200 cph/cm$^2$ or less, it is possible to prevent any soft errors in an electronic device.

The invention claimed is:

1. A solder alloy, consisting of:
    0.005% by mass or more and 0.1% by mass or less of Mn;
    0.005% by mass or more and 0.1% by mass or less of Ge;
    more than 0% by mass and 4% by mass or less of Ag;
    0.1% by mass or more and 10% by mass or less of Sb;
    optionally, a total amount of 0.1% by mass or more and 10% by mass or less of at least one element selected from the group consisting of Bi and In;
    optionally, 0.002% by mass or more and 0.1% by mass or less of Ga;
    optionally, a total amount of 0.005% by mass or more and 0.3% by mass or less of at least one element selected from the group consisting of Ni, Co and Fe; and
    remainder of Sn,
    wherein, when the solder alloy includes at least one element selected from the group consisting of Bi and In, the total amount of Bi, In, and Sb is 0.1% by mass or more and 10% by mass or less, and
    wherein the amount of Mn is equal to or less than the amount of Ge.

2. A solder ball, wherein the solder ball comprises the solder alloy according to claim 1.

3. A solder joint, wherein the solder joint comprises the solder ball according to claim 2.

4. A chip solder, wherein the chip solder comprises the solder alloy according to claim 1.

5. A solder joint, wherein the solder joint comprises the chip solder according to claim 4.

6. A solder paste, wherein the solder paste comprises the solder alloy according to claim 1.

7. A solder joint, wherein the solder joint comprises the solder paste according to claim 6.

8. A solder joint, wherein the solder joint comprises the solder alloy according to claim 1.

* * * * *